US008310884B2

(12) United States Patent
Iwai et al.

(10) Patent No.: US 8,310,884 B2
(45) Date of Patent: Nov. 13, 2012

(54) SEMICONDUCTOR MEMORY DEVICE

(75) Inventors: Takayuki Iwai, Setagaya-ku (JP); Shuso Fujii, Kawasaki (JP); Shinji Miyano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 12/723,922

(22) Filed: Mar. 15, 2010

(65) Prior Publication Data
US 2011/0032778 A1 Feb. 10, 2011

(30) Foreign Application Priority Data

Aug. 6, 2009 (JP) .................................. 2009-183796

(51) Int. Cl.
*G11C 7/22* (2006.01)
(52) U.S. Cl. ....... 365/189.16; 365/189.14; 365/189.011; 365/189.08; 365/189.15; 365/207
(58) Field of Classification Search ............ 365/189.16, 365/189.14, 189.15, 189.011, 207, 196, 189.08
See application file for complete search history.

(56) References Cited

U.S. PATENT DOCUMENTS

| 6,850,449 B2 * | 2/2005 | Takahashi ..................... 365/222 |
| 2010/0157693 A1 | 6/2010 | Iwai et al. |

FOREIGN PATENT DOCUMENTS

| JP | 02-059943 | 2/1990 |
| JP | 09-017178 | 1/1997 |
| JP | 09017178 | 1/1997 |
| JP | 2004-134026 | 4/2004 |
| JP | 2005-190585 | 7/2005 |

OTHER PUBLICATIONS

Japanese Office Action for Japanese Application No. 2009-183796 mailed on Sep. 13, 2011.

* cited by examiner

*Primary Examiner* — Thong Q Le
(74) *Attorney, Agent, or Firm* — Turocy & Watson, LLP

(57) ABSTRACT

A sense amplifier circuit senses and amplifies a signal read from memory cells arranged at intersections of word-lines and bit-lines. A write circuit reads first data held in a first memory cell of the memory cells, and writes second data corresponding to the first data in a second memory cell different from the first memory cell. A data latch circuit holds data read from the first memory cell. A logic operation circuit performs a logic operation using data read from the second memory cell and data held in the data latch circuit as input values and outputs third data as an operation value. A write-back circuit writes the third data back to the first memory cell.

18 Claims, 9 Drawing Sheets

SEMICONDUCTOR MEMORY DEVICE

CROSS REFERENCE TO RELATED APPLICATIONS

This application is based on and claims the benefit of priority from prior Japanese Patent Application No. 2009-183796, filed on Aug. 6, 2009, the entire contents of which are incorporated herein by reference.

BACKGROUND OF THE INVENTION

1. Field of the Invention

The present invention relates to semiconductor memory devices, and more particularly, to volatile semiconductor memory devices that need refresh operations.

2. Description of the Related Art

Recent prevalence of handheld devices has increased the importance of low power consumption embedded DRAMs. A variety of embedded DRAMs have been developed as means to reduce the power consumption. For example, a twin-cell DRAM has two memory cells connected to the same word-line, and the memory cells store complementary data or the like, thereby improving the retention time and thus reducing the power consumption. Additionally, JPH 9-17178 proposes a twin-cell DRAM in which two memory cells hold the same data and operate the logical OR thereof or the like, thereby improving the retention time and thus reducing the power consumption.

The twin-cell DRAM has a problem, however, that switching between the single-cell configuration and the twin-cell configuration needs data compression and decompression, thus increasing the switching time and the operation time as well as requiring a dedicated circuit for the data compression and decompression, which increases the circuit area.

SUMMARY OF THE INVENTION

A semiconductor memory device according to an aspect of the present invention includes: a memory cell array comprising a plurality of memory cells arranged at intersections of word-lines and bit-lines; a sense amplifier circuit configured to sense and amplify a signal read from the memory cells; a write circuit configured to write, according to first data held in a first memory cell of the memory cells, second data corresponding to the first data in a second memory cell different from the first memory cell as second data corresponding to the first data; a data latch circuit configured to hold data read from the first memory cell; a logic operation circuit configured to perform a logic operation using data read from the second memory cell and data held in the data latch circuit as input values, and output third data as an operation value; and a write-back circuit configured to write the third data back to the first memory cell.

DETAILED DESCRIPTION OF THE EMBODIMENTS

With reference to the accompanying drawings, preferred embodiments of the present invention will be described in more detail.

First Embodiment

First, with reference to FIG. 1, a DRAM according to a first embodiment of the present invention is described below. The DRAM includes a memory cell array 11 and a column gate 12.

The memory cell array 11 includes memory cells MC in a matrix at intersections of word-lines WL and bit-lines BL. By way of example, the memory cell MC includes one cell-capacitor CC and one cell-transistor CT that are connected in series. The memory cell MC stores data using a charge (not shown) held in the cell capacitor CC.

In the bit-lines BL, a bit-line BLt<k> and a bit-line BLc<k> compose a complementary bit-line pair. Each complementary bit-line pair has a sense amplifier circuit SA formed therebetween. FIG. 1 shows a DRAM that utilizes the so-called folded bit-line structure. In the structure, the bit-line BLt<k> and the bit-line BLc<k> composing a complementary bit-line pair are provided in the same memory cell array 11. The bit-line BLt<k> and the bit-line BLc<k> form a twisted bit-line structure in which the lines twist (intersect with each other) in predetermined regions. The structure may reduce noise between the bit-lines.

Figure 1:
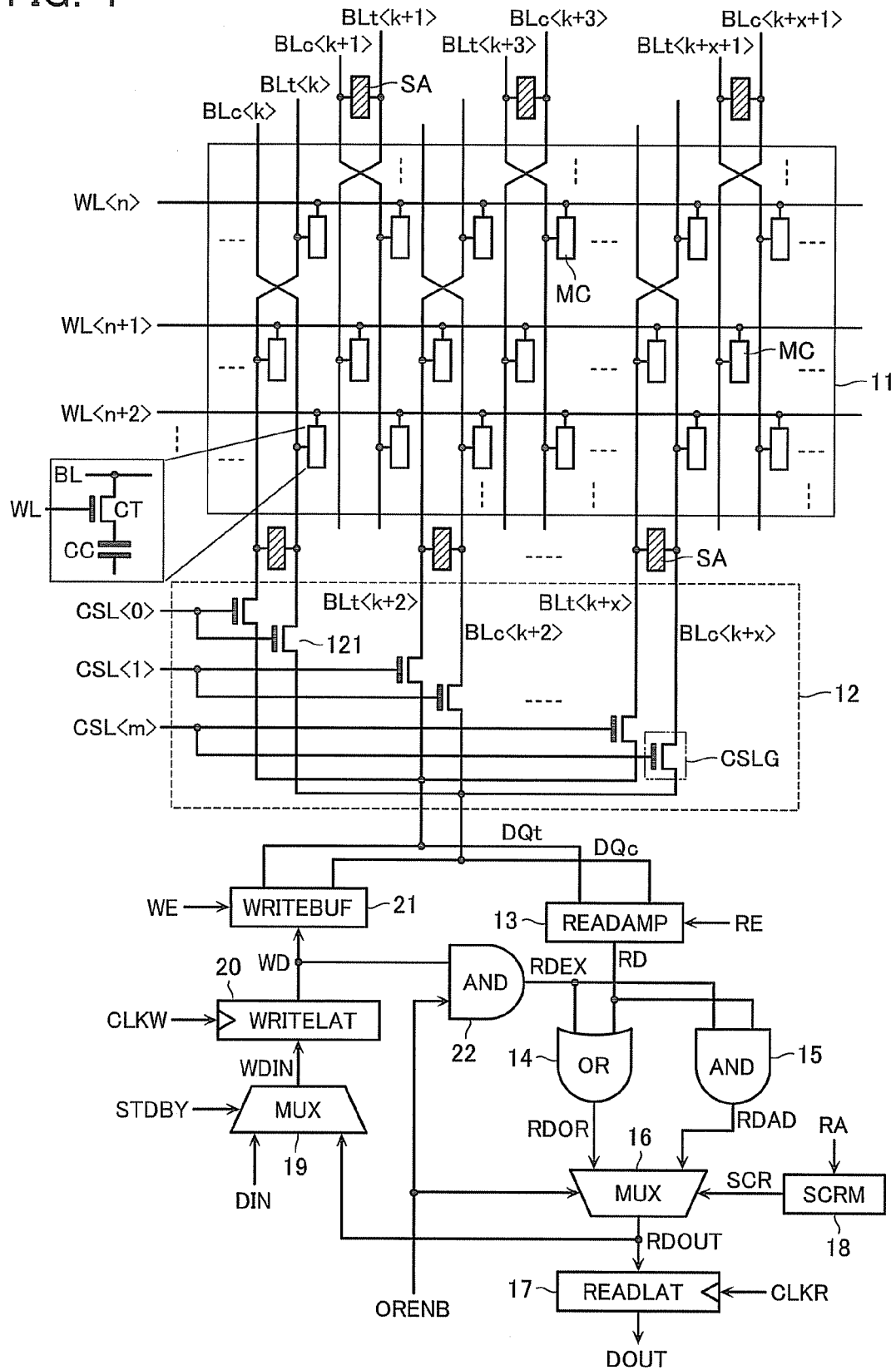
FIG. 1 shows an entire configuration of a DRAM according to a first embodiment of the present invention.

The sense amplifier circuit SA includes a general differential amplification circuit (not shown in FIG. 1). The circuit is adapted to sense and amplify a potential difference between the complementary bit-line pair. Note that in FIG. 1, by way of example, the DRAM has odd-numbered complementary bit-line pairs that are extended to the lower end of the memory cell array 11 and connected to the sense amplifier circuits SA, and even-numbered complementary bit-line pairs that are extended to the upper end of the memory cell array 11 and connected to the sense amplifier circuits SA.

The column gate 12 includes a set of selection transistors 121. Each of the transistors 121 is provided for the respective bit-lines BL. The gate of each selection transistor 121 is provided with a different column selection signal CSL for each complementary bit-line pair. Any complementary bit-line pair is selectively connected to a read amplifier 13 and a write buffer 21 via a data-line pair of DQt and DQc. Turning on the selection transistors 121 causes reading of data from the memory cells MC and writing of data to the memory cells MC connected to the complementary bit-line pair.

The read amplifier 13 is activated by a read-enable signal RE. The amplifier 13 is connected to the sense amplifier circuits SA via the column gate 12. The sense amplifier circuit SA amplifies the voltage of the complementary bit-line pair. The voltage is then further amplified by the read amplifier 13 that in turn outputs an amplification signal (read data) RD. The amplification signal RD is provided to an OR gate 14 and an AND gate 15. The other input terminal of each OR gate 14 and AND gate 15 is provided with an output signal RDEX from an AND gate 22 as will be described below.

In a normal read mode, the output signal RDEX from the AND gate 22 is "L," and the output signal RDOR from the OR gate 14 varies synchronously with the amplification signal RD. The output signal RDOR is output externally via a multiplexer 16 and a read latch 17 as an output signal DOUT. The read latch 17 is provided with a clock signal CLKR. In response to the rising of the clock signal CLKR, the output signal DOUT is output externally.

The DRAM in this embodiment may also function as a twin-cell DRAM, if desired. Specifically, the DRAM in this embodiment usually has a configuration in which 1-bit data is held by one memory cell MC, and may temporarily have the twin-cell configuration in a specific operation mode.

The specific operation mode is described below. Specifically, in the specific operation mode, data in the memory cell MCo to be read (the copy-source memory cell (a first memory cell)) is written (copied) to a different memory cell MCc (a copy-destination memory cell (a second memory cell)). A multiplexer 19, a write latch 20, and the write buffer 21 function together as a write circuit to perform the copy operation. Although not shown, the copy-source and copy-destination memory cells MCo and MCc are subjected to the refresh control as in the conventional twin-cell configuration. In this case, two memory cells hold together 1-bit data, and so the refresh operation may be performed in a longer cycle than in the normal operation mode. The power consumption may thus be reduced.

First, data is read from the copy-source memory cell MCo and then held in the temporary write latch 20 (the write latch 20 functions as a data latch circuit that holds data read from the copy-source memory cell MCo).

Data is then read from the copy-destination memory cell MCc. This data and the data held in the write latch 20 (data read from the copy-source memory cell MCo) are then subjected to a logic operation in the OR gate 14 or the AND gate 15.

A scramble control circuit 18 functions as follows. According to a row address RA, the circuit 18 determines whether the copy-source memory cell MCo utilizes a scrambled writing (in which data different from the externally provided write data is written according to a specific rule). In accordance with the determination, the circuit 18 changes the logic of a control signal SCR. The multiplexer 16 uses the control signal SCR from the scramble control circuit 18 to selectively output the output signal RDOR from the OR gate 14 or the output signal RDAD from the AND gate 15 as a signal RDOUT. If the scrambled writing is not utilized, then the multiplexer 16 selects the output signal RDOR from the OR gate 14. If the scrambled writing is utilized, then the multiplexer 16 selects the output signal RDAD from the AND gate 15. The signal RDOUT is then temporarily held in the read latch 17. The read latch 17 outputs externally the signal RDOUT as an output signal DOUT in response to the clock signal CLKR.

The logic operation result is output externally as read data (the output signal DOUT). According to the logic operation result, data is written back to the copy-source memory cell MCo by the multiplexers 16 and 19, the write latch 20, and the write buffer 21. In this way, in the specific operation mode, the refresh control and the read operation are performed according to the twin-cell configuration. On the other hand, in the normal operation mode, 1-bit data is held in one memory cell. Accordingly, low power consumption may thus be provided, while increase in circuit area may be restricted.

The signal RDOUT is also provided to the multiplexer 19. The multiplexer 19 is also provided with an input signal DIN. The signal DIN is provided externally as write data in the normal data writing. In response to a control signal STDBY, the multiplexer 19 inputs selectively the input signal DIN and the signal RDOUT to the write latch 20 as a write input signal WDIN. The signal STDBY switches from "L" to "H" to change to the twin-cell configuration. If the control signal STDBY is "H," the input of the signal DIN to the multiplexer 19 is inhibited and only the signal RDOUT is allowed to be input.

The signal RDOUT is input to the multiplexer 19 and is then output by the multiplexer 19 as the write input signal WDIN, and held in the write latch 20. The write latch 20 outputs, in response to a clock signal CLKW, a latched signal as a signal WD. When copying operation to the copy-destination memory cell MCc is performed, the signal WD is provided to the bit-line pair to which the memory cell MCc is connected, via the write buffer 21 and the column gate 12. The signal WD is also provided to the OR gate 14 and the AND gate 15 via the AND gate 22 as the signal RDEX.

The AND gate 22 receives the signal WD and an enable signal ORENB as input signals. The AND gate 22 then makes the logical AND of the two signals and outputs it as the signal RDEX. In other words, the AND gate 22 functions as a gate circuit that outputs the signal WD according to the enable signal ORENB. The signal RDEX output to the OR gate 14 or the NAND gate 15 causes the logic operation of data of the copy-source memory cell MCo and data of the copy-destination memory cell MCc.

Figure 2:
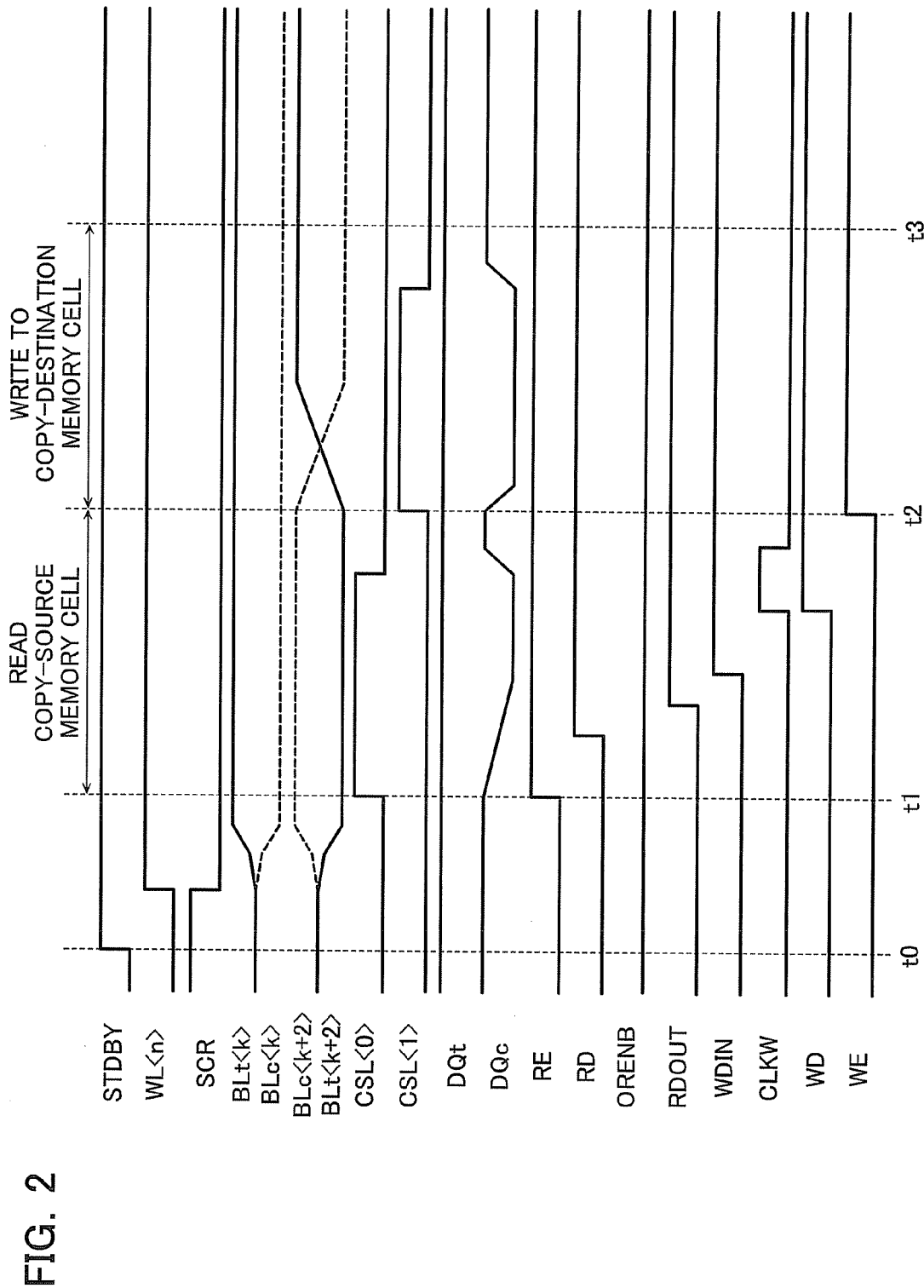
FIG. 2 illustrates a procedure for reading data in a twin-cell configuration according to the first embodiment.
Figure 3:
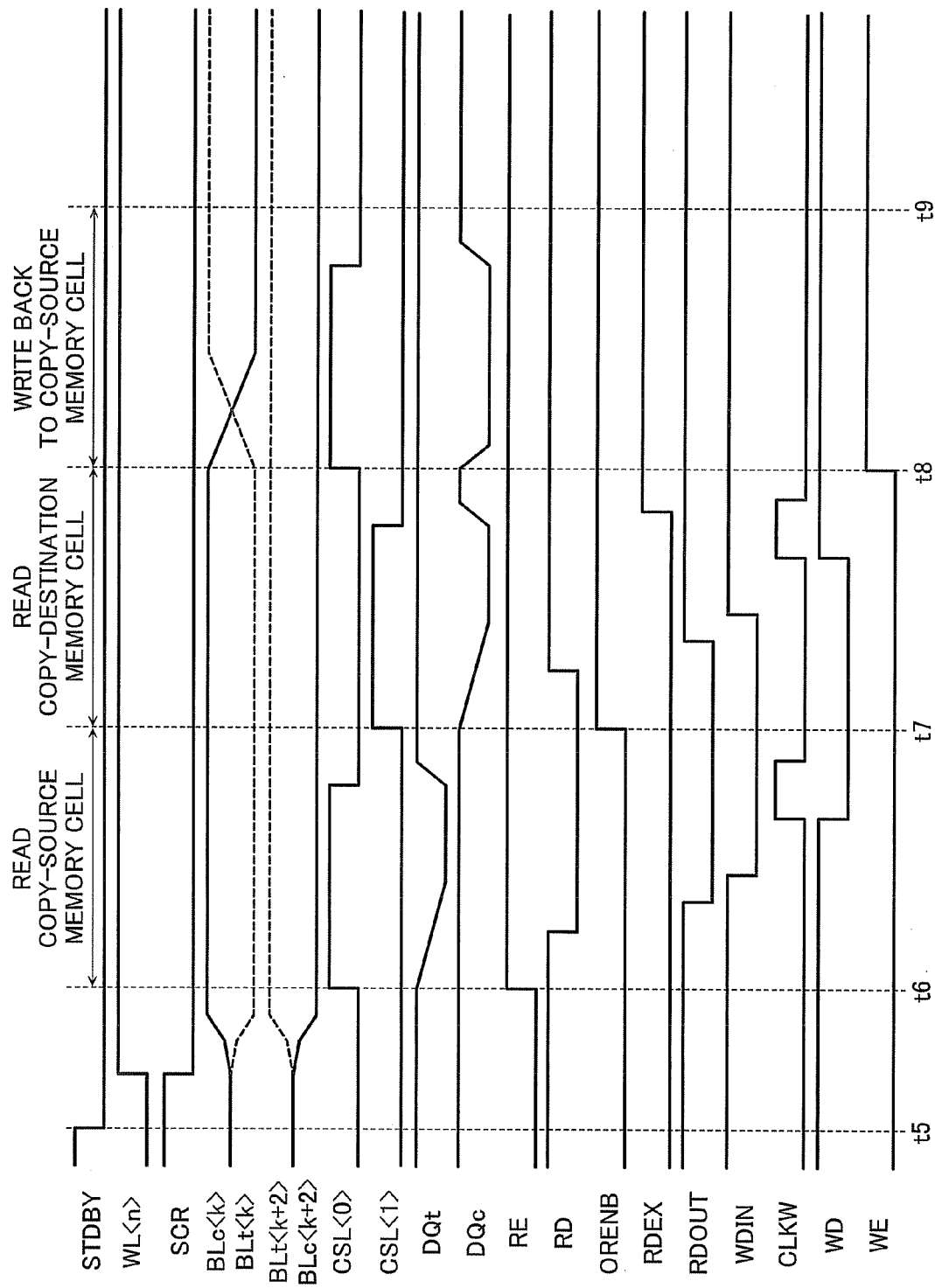
FIG. 3 illustrates a procedure for reading data in a twin-cell configuration according to the first embodiment.

With reference to FIGS. 2 and 3, a procedure for reading data in the twin-cell configuration according to this embodiment will be described below. In the normal operation mode, the DRAM in this embodiment stores 1-bit data in one memory cell. In an operation mode for reading data in the twin-cell configuration, the DRAM performs as follows.

(1) Reading data from the copy-source memory cell MCo, and writing (copying) the read data to the copy-destination memory cell MCc. Note that although in the following description of the embodiments, the copy-source memory cell MCo and the copy-destination memory cell MCc are disposed along the same word-line WL, the present invention is not limited thereto, and a memory cell MC disposed along a word-line different from that of the copy-source memory cell MCo may be the copy-destination memory cell MCc.

(2) Reading data from the copy-source memory cell MCo and holding the data in the temporary latch circuit, reading data from the copy-destination memory cell MCc, and performing a logic operation of both read data. Outputting externally the logic operation result as read data, and using the logic operation result to write data back to the copy-source memory cell MCo.

FIG. 2 is a timing diagram for performing the procedure (1).

First, with reference to FIG. 2, the procedure (1) will be described in more detail.

First, at time t0, the control signal STDBY changes from "L" to "H." The data read mode in the twin-cell configuration thus starts.

Then, the word-line WL<n> connected to the to-be-read (copy-source) memory cell MCo rises from "L" to "H." The complementary bit-line pair BLt<k> and BLc<k> connected to the memory cell MCo thus experience voltage rises corresponding to data held by the memory cell MCo. The voltage is amplified by the sense amplifier circuit SA.

Then at time t1, the column selection signal CSL<0> corresponding to the memory cell MCo rises "L" to "H." The voltages of the complementary bit-line pair BLt<k> and BLc<k> thus appear on the data-lines DQt and DQc.

At the same time t1, the signal RE rises from "L" to "H," causing the read amplifier 13 to further amplify the voltages on the data-lines DQt and DQc, and output them as the amplification signal RD. The amplification signal RD enters the OR gate 14 that in turn outputs the signal RDOR. The signal RDOR is then selected by the multiplexer 16 that in turn outputs the signal RDOUT.

The signal RDOUT is provided to the multiplexer 19 that in turn outputs the write input signal WDIN. The signal WDIN enters the write latch 20 that in turn holds it as the data read from the copy-source memory cell MCo. In the normal data write mode, the write latch 20 latches the input data WDIN as the write data. In contrast, in the twin-cell configuration data read mode, the latch 20 functions as a circuit to temporarily hold data of the copy-source memory cell MCo. In this way, the write latch 20 may serve both to temporarily hold written data in the normal data write mode and to temporarily hold data of the copy-source memory cell MCo in the twin-cell configuration data read mode.

The clock signal CLKW rises at the next timing, causing the write latch 20 to output the signal (write data) WD. The write buffer 21 buffers the signal WD. Then at time t2, the column selection signal CSL<1> rises, causing the write buffer to write data corresponding to the signal WD to the copy-destination memory cell MCc. Specifically, the bit-lines BLt<k+2> and BLc<k+2> to which the copy-destination memory cell MCc is connected experience voltage rises corresponding to the signal WD, i.e., data held by the copy-source memory cell MCo. Thus, the operation (1) is completed.

With reference now to FIG. 3, the operation (2) will be described in more detail. FIG. 3 is a timing diagram for performing the procedure (2). The DRAM may utilize the scrambled writing system when the following two structures are utilized: the so-called folded bit-line structure (in which a complementary bit-line pair exists in the same memory mat); and the twisted bit-line structure (in which complementary bit-lines twist (intersect with each other) in predetermined regions). FIG. 3 shows an example where it is assumed that data is not scrambled before it is written to the memory cell MCo to be read.

At time t5, the control signal STDBY changes from "H" to "L." Then, the word-line WL<n> to which the copy-source memory cell MCo and the copy-destination memory cell MCc are connected rises from "L" to "H." The complementary bit-line pair BLt<k> and BLc<k> to which the copy-source memory cell MCo is connected thus experience voltage rises corresponding to data held by the memory cell MCo. The complementary bit-line pair BLt<k+2> and BLc<k+2> to which the copy-destination memory cell MCc is connected experience voltage rises corresponding to data held by the memory cell MCc. Note that at the same time, the control signal SCR from the scramble control circuit 18 changes to "L."

Then at time t6, the column selection signal CSL<0> rises from "L" to "H." The voltages of the complementary bit-line pair BLt<k> and BLc<k> connected to the copy-source memory cell MCo are thus reflected to the data-lines DQt and DQc. The read-enable signal RE rises to "H," making the signal RD to be a voltage corresponding to the voltages of the data-lines DQt and DQc. The signal RDOUT changes accordingly and is provided to the multiplexer 19. The signal WDIN also changes accordingly, and causes the write latch 20 to latch data read from the copy-source memory cell MCo.

Then at time t7, the column selection signal CSL<1> rises from "L" to "H." The voltages of the complementary bit-line pair BLt<k+2> and BLc<k+2> connected to the copy-destination memory cell MCc are thus reflected to the data-lines DQt and DQc. The enable signal ORENB also rises from "L" to "H." Data held by the write latch 20 (data read from the memory cell MCo) is thus provided to one input terminal of the OR gate 14 via the AND gate 22 as the signal RDEX. The other input terminal of the OR gate 14 receives the signal RD corresponding to data held by the memory cell MCc. The OR gate 14 performs the logical OR operation of the signal RDEX and the signal RD, and outputs the operation result as the signal RDOR. The signal RDOR enters the multiplexer 16 that in turn outputs externally the signal DOUT (read data). The signal DOUT also enters the multiplexer 19 and the write latch 20. Then at time t8, the column selection signal CSL<0> rises again from "L" to "H" for a predetermined period of time. The enable signal WE also rises to "H." Data is thus written to the copy-source memory cell MCo according to the data held by the write latch 20. Specifically, according to the logical OR operation result in the OR gate 14, data is written back to the memory cell MCo. In this way, the operation (2) is ended and the reading in the twin-cell configuration is completed.

Figure 4:
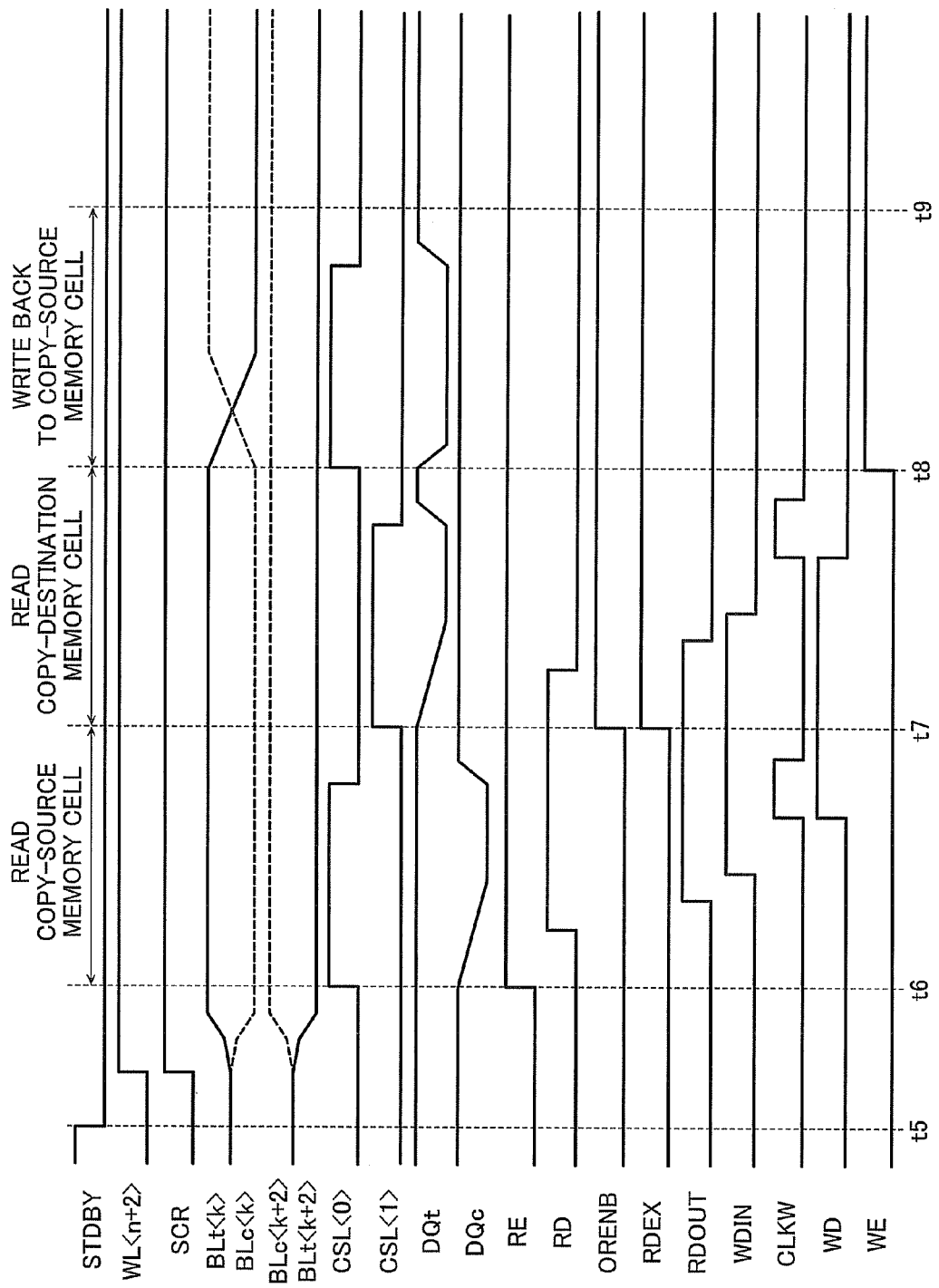
FIG. 4 illustrates a procedure for reading data in a twin-cell configuration according to the first embodiment.

FIG. 4 is a timing diagram for performing the operation (2) when data is scrambled before it is written to the memory cell MCo to be read. The same operation as in FIG. 3 is performed except that the output signal from the AND gate 15 is selected, not from the OR gate 14, and data of the complementary wiring line is inverted because data is scrambled before it is written.

Second Embodiment

Figure 5:
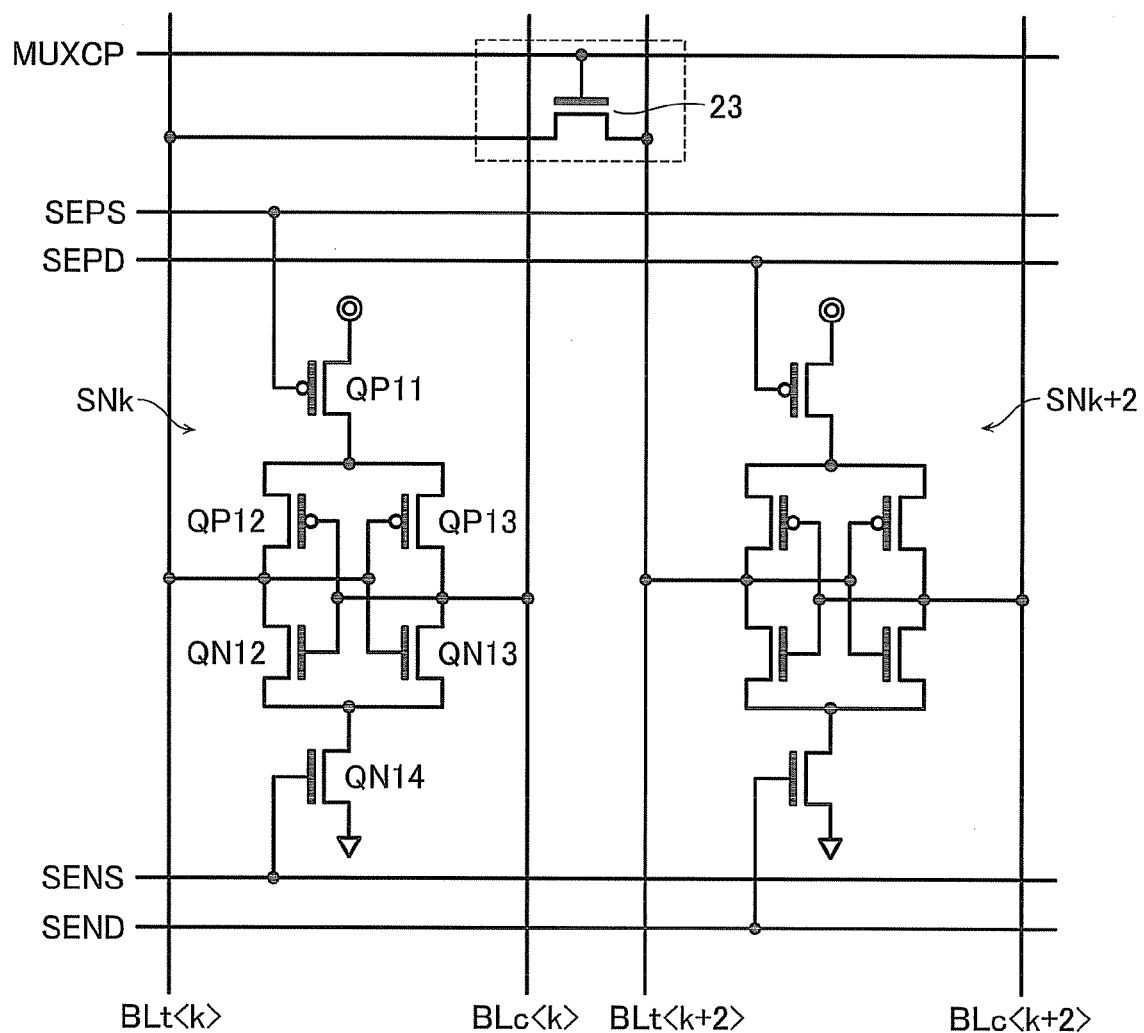
FIG. 5 shows a configuration of a DRAM according to a second embodiment of the present invention.

With reference now to FIG. 5, a DRAM configuration according to a second embodiment of the present invention will be described below. The entire configuration of this embodiment is generally the same as that of the DRAM in FIG. 1. This embodiment differs, however, from the first embodiment in that data of the copy-source memory cell MCo is copied to the copy-destination memory cell MCc using an additional transfer gate circuit for copy operation 23. The transfer gate circuit for copy operation 23 includes one nMOS transistor connected between the bit-line BLt<k> and the bit-line BLt<k+2>. The nMOS transistor forms a current path between the two bit-lines. The nMOS transistor is rendered conductive by the raising of the control signal MUXCP to "H." When the signal read from the copy-source memory cell MCo is amplified by the sense amplifier circuit SA and appears on the bit-line BLt<k>, the transfer gate circuit for copy operation 23 rendered conductive transfers a voltage corresponding to data held by the memory cell MCo to the bit-line BLt<k+2>. Then the word-line WL of the copy-destination memory cell MCc may be activated to write data held by the copy-source memory cell MCo to the memory cell MCc.

Figure 6:
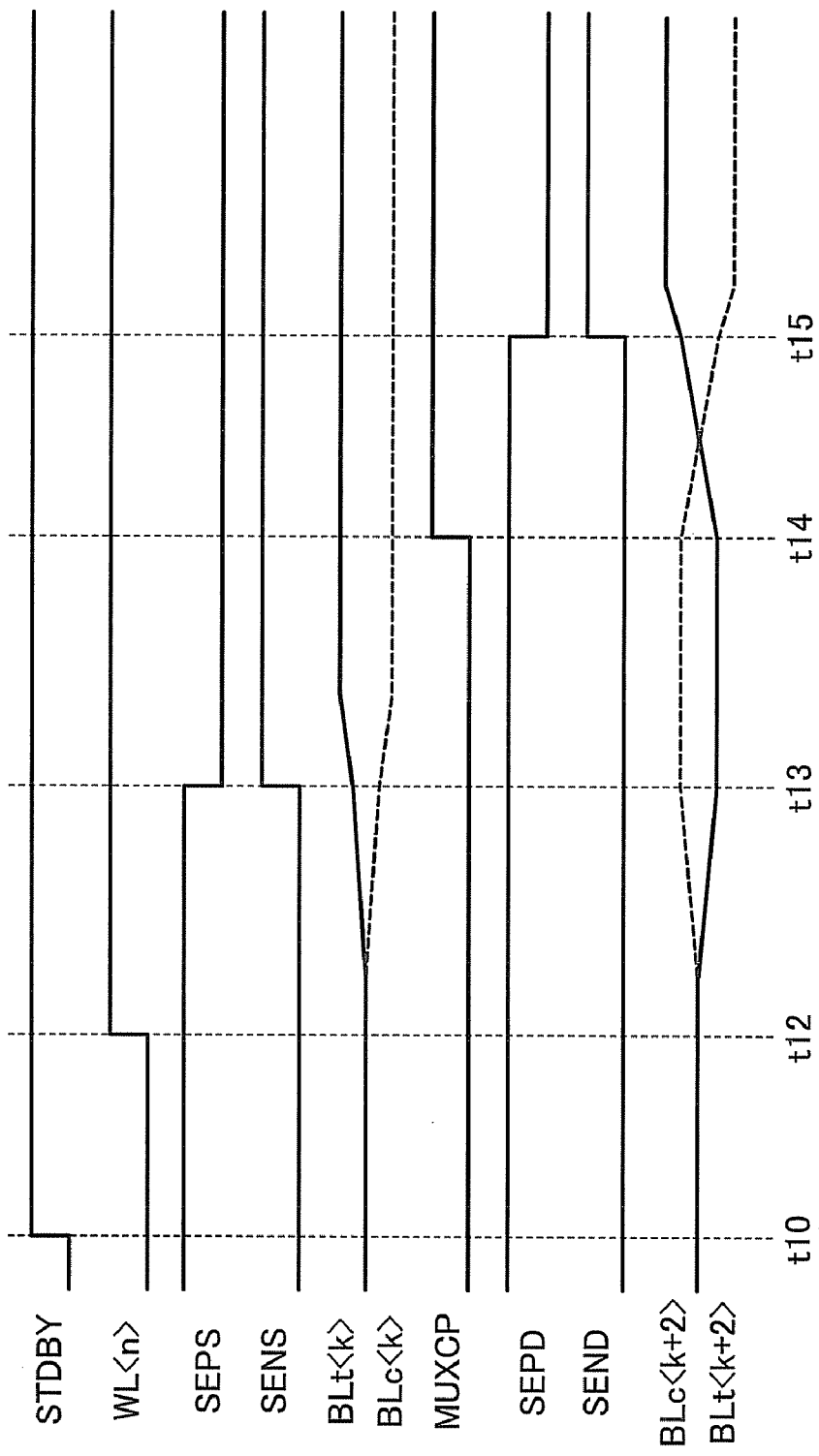
FIG. 6 illustrates a procedure for reading data in a twin-cell configuration according to the second embodiment.

FIG. 6 is a timing diagram for reading data in the twin-cell configuration in the DRAM of the second embodiment.

At time t10, the control signal STDBY changes to "H." At time t12, the word-line WL<n> rises to "H," reading data from the copy-source memory cell MCo. Then at time t13, the signals SEPS and SENS change to "L", "H," respectively. The sense amplifier circuit SNk connected to the complementary bit-line pair BLt<k> and BLc<k> is thus activated. The voltages of the complementary bit-lines BLt<k> and BLc<k> are thereby differentially amplified.

Then at time t14, the control signal MUXCP rises to "H." The voltage of the bit-line BLt<k> is thus transferred to the bit-line BLt<k+2>. Then at time t15, the signals SEPD and SEND change to "L", "H," respectively. The sense amplifier circuit SNk+2 connected to the complementary bit-line pair BLt<k+2> and BLc<k+2> is thus activated. The voltages of the complementary bit-lines BLt<k+2> and BLc<k+2> are thereby differentially amplified. In this way, data of the copy-source memory cell MCo is copied to the copy-destination memory cell MCc. In the first embodiment, data needs to be written to the write latch 20 for copy operation. In this embodiment, however, the copy operation may be completed within the memory cell array, thereby increasing the speed of the operation. Note that the operation (2) in the twin-cell configuration is as described with respect to FIGS. 3 and 4, and thus their detailed description is omitted here.

Third Embodiment

Figure 7:
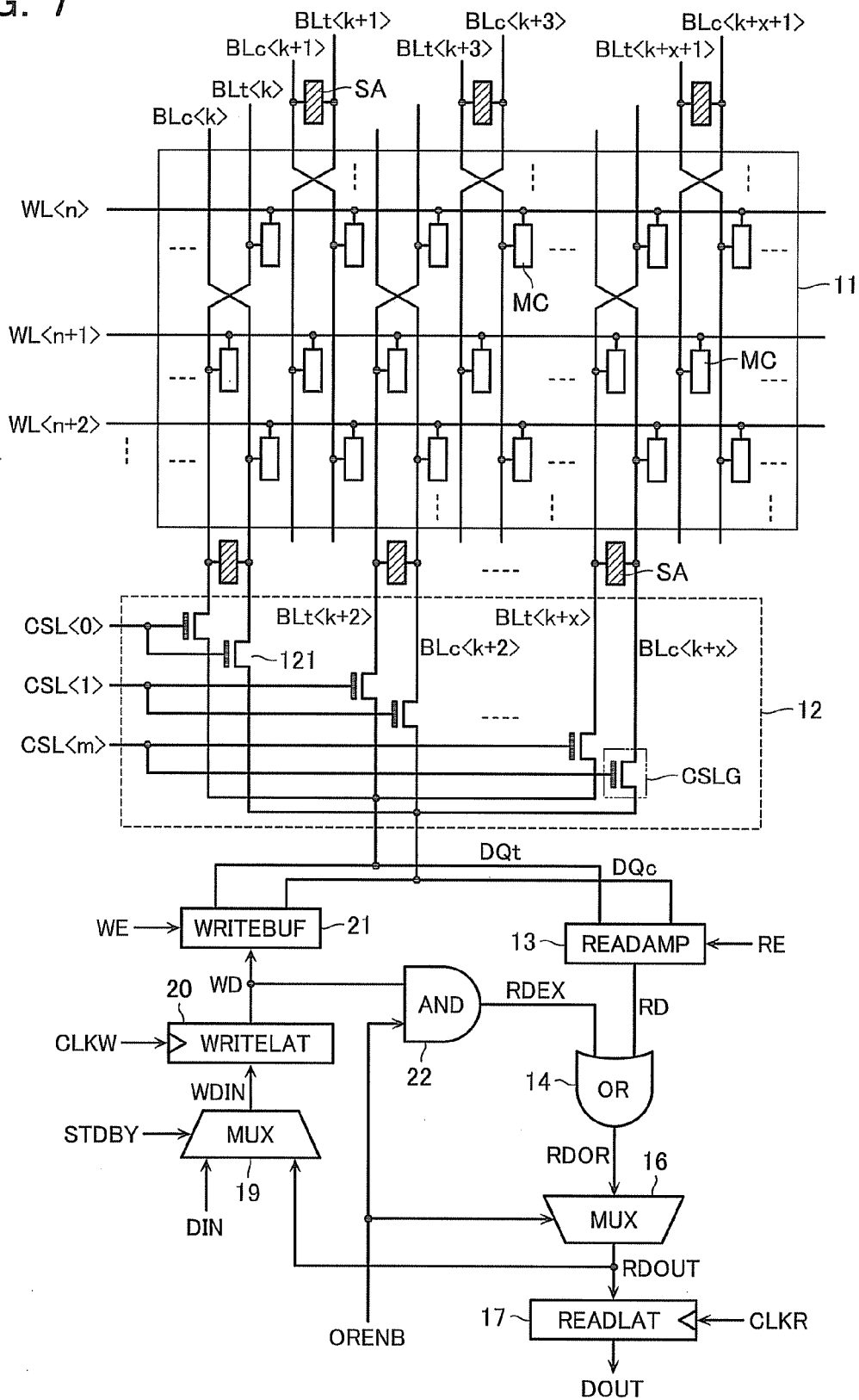
FIG. 7 shows a configuration of a DRAM according to a third embodiment of the present invention.

With reference to FIG. 7, a third embodiment of the present invention will be described below. In FIG. 7, like elements as those of the DRAM in the first embodiment are designated by like reference numerals as those in FIG. 1, and their detailed description is omitted here. The DRAM in this embodiment differs from that in the first embodiment in that data is not scrambled before it is written to the memory cell array 11 and thus the scramble control circuit 18 is omitted. Because the scramble control is not performed, the AND gate 15 is omitted and the logic operation of data of the copy-source memory cell MCo and data of the copy-destination memory cell MCc is performed only by the OR gate 14. The other points are similar to those in the first embodiment.

Figure 8:
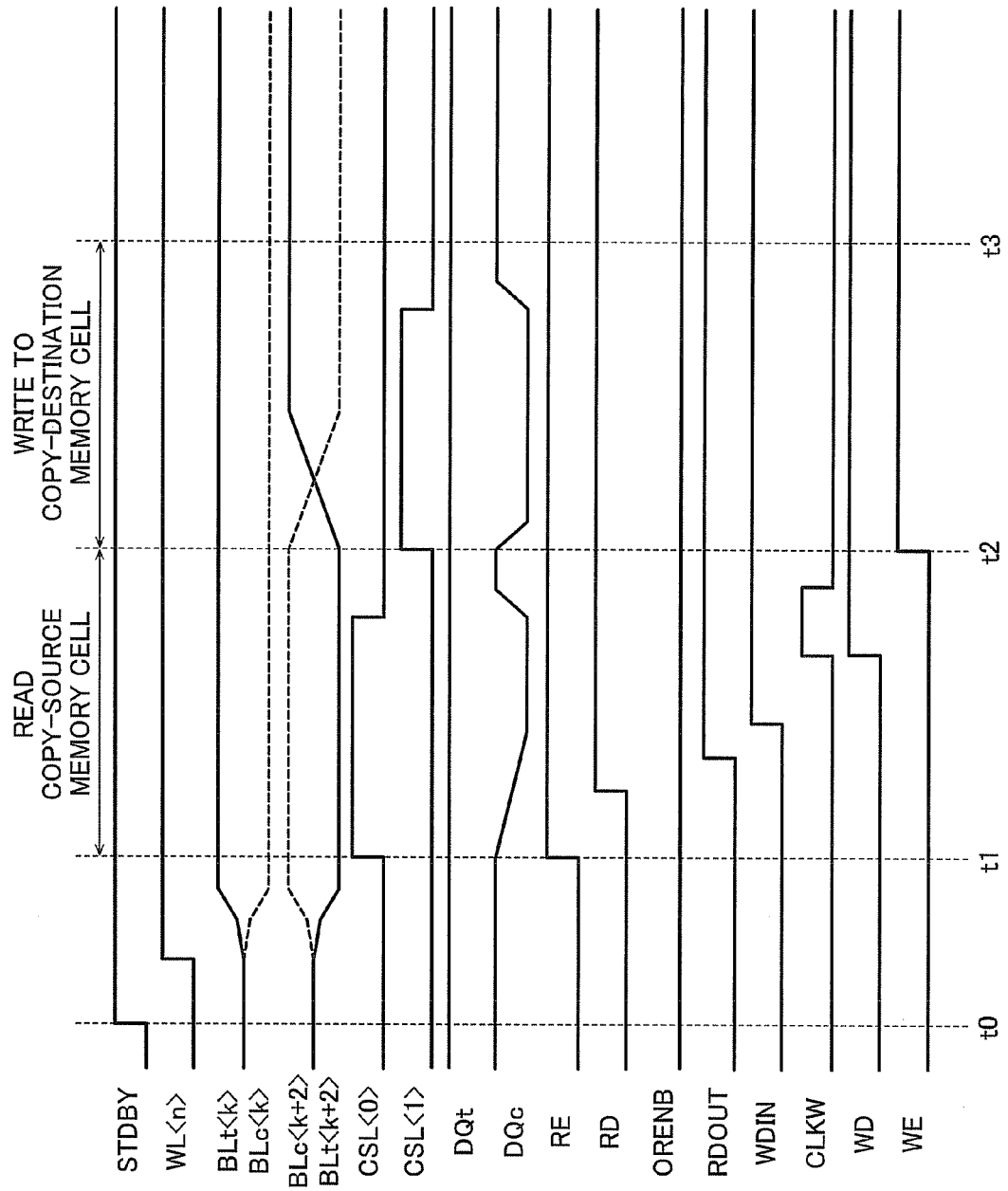
FIG. 8 illustrates a procedure for reading data in a twin-cell configuration according to the third embodiment.
Figure 9:
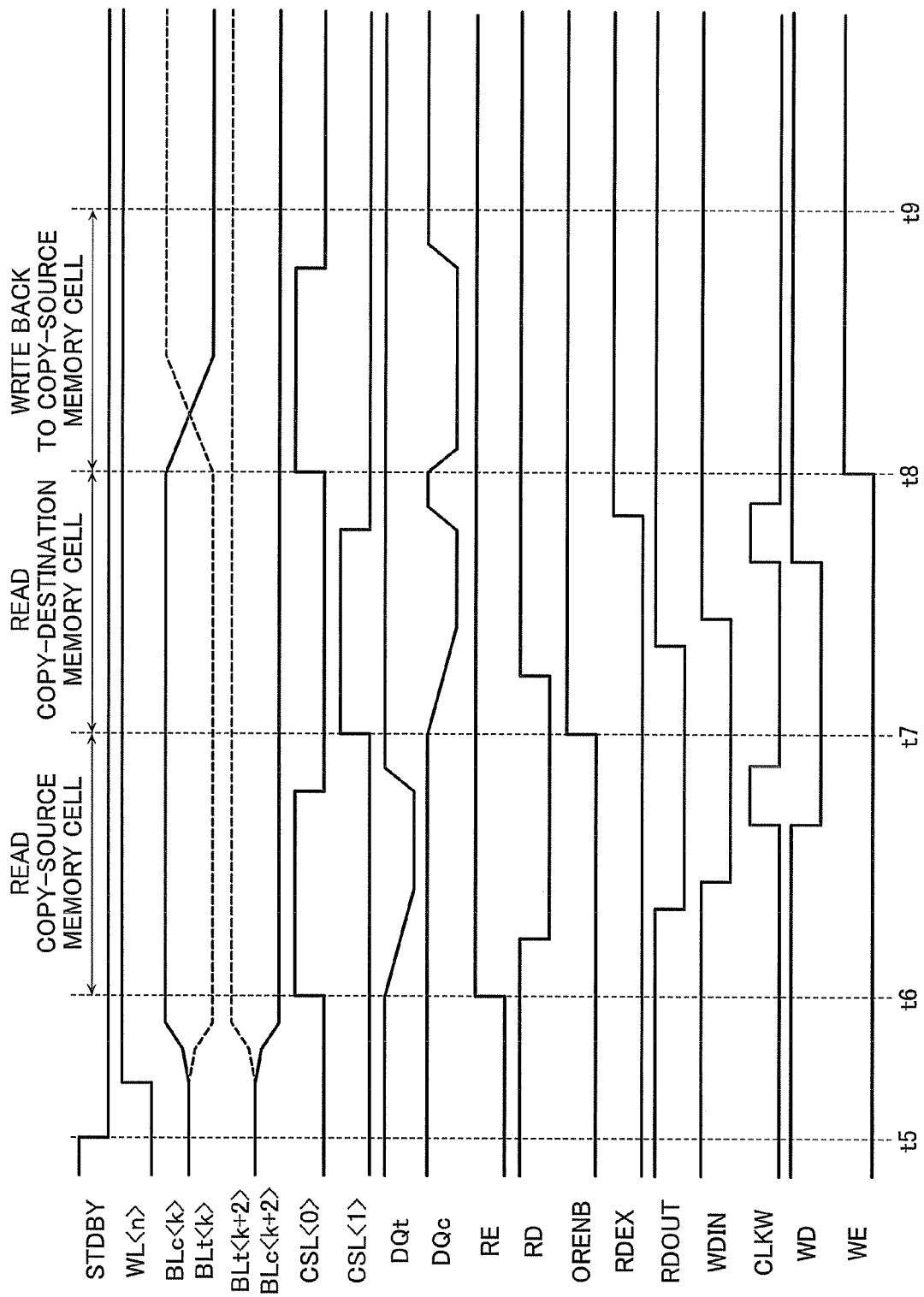
FIG. 9 illustrates a procedure for reading data in a twin-cell configuration according to the third embodiment.

FIGS. 8 and 9 are timing diagrams for reading data in the twin-cell configuration in this embodiment. FIGS. 8 and 9 are similar to FIGS. 3 to 5 except that the scramble control signal SCR is not used, and thus their detailed description is omitted here.

Thus, although the invention has been described with respect to particular embodiments thereof, it is not limited to those embodiments. It will be understood that various modifications and additions and the like may be made without departing from the spirit of the present invention.

What is claimed is:

1. A semiconductor memory device configured to selectively adopt a twin-cell configuration and a single-cell configuration, comprising:
    a memory cell array comprising a plurality of memory cells arranged at intersections of word-lines and bit-lines;
    a sense amplifier circuit configured to sense and amplify a signal read from the memory cells;
    a write circuit configured to write, according to first data held in a first memory cell of the memory cells, second data corresponding to the first data to a second memory cell different from the first memory cell as second data corresponding to the first data, when the twin-cell configuration is selected, the second memory cell being connected to a sense amplifier circuit different from that connected to the first memory cell;
    a data latch circuit configured to hold data read from the first memory cell;
    a logic operation circuit configured to perform a logic operation using data read from the second memory cell and data held in the data latch circuit as input values, and output third data as an operation value; and
    a write-back circuit configured to write the third data back to the first memory cell.

2. The semiconductor memory device according to claim 1, wherein
    the data latch circuit is a write data-latch circuit temporarily holding write data when writing data to the memory cell.

3. The semiconductor memory device according to claim 1, wherein
    the logic operation circuit is adapted to perform different logic operations between when a memory cell in the memory cell array that is to be subjected to scrambled writing is read and when a memory cell not to be subjected to scrambled writing is read.

4. The semiconductor memory device according to claim 3, wherein
    a pair of adjacent bit-lines form a complementary bit-line pair, and each complementary bit-line pair has one sense amplifier circuit connected thereto.

5. The semiconductor memory device according to claim 1, wherein
    the write circuit is adapted to transfer a voltage of the first bit-line connected to the first memory cell to the second bit-line connected to the second memory cell.

6. The semiconductor memory device according to claim 1, further comprising a gate circuit configured to supply data held in the data latch circuit to the logic operation circuit in response to an enable signal.

7. The semiconductor memory device according to claim 1, wherein
    the logic operation circuit comprising:
    a first operation circuit configured to perform a first logic operation using data read from the second memory cell and data held in the data latch Circuits input values, and outputting fourth data;
    a second operation circuit configured to perform a second logic operation using data read from the second memory cell and data held in the data latch circuit as input values, and outputting fifth data; and
    a multiplexer configured to output the fourth data as the third data when a memory cell in the memory cell array that is to be subjected to scrambled writing is read, and output the fifth data as the third data when a memory cell not to be subjected to scrambled writing is read.

8. The semiconductor memory device according to claim 1, wherein the write circuit further comprises a transfer gate circuit configured to selectively form a current path between the first bit-line connected to the first memory cell and the second bit-line connected to the second memory cell.

9. The semiconductor memory device according to claim 8, wherein the transfer gate circuit is adapted to be rendered conductive when a signal read from the first memory cell is amplified by the sense amplifier circuit and appears on the first bit-line.

10. The semiconductor memory device according to claim 8, wherein
    the logic operation circuit is adapted to perform different logic operations between when a memory cell in the memory cell array that is to be subjected to scrambled writing is read and when a memory cell not to be subjected to scrambled writing is read.

11. The semiconductor memory device according to claim 8, further comprising a gate circuit configured to supply data held in the data latch circuit to the logic operation circuit in response to an enable signal.

12. The semiconductor memory device according to claim 1, wherein
    a pair of adjacent bit-lines form a complementary bit-line pair, and each complementary bit-line pair has one sense amplifier circuit connected thereto.

13. A semiconductor memory device comprising:
- a memory cell array comprising a plurality of memory cells arranged at intersections of word-lines and bit-lines, each memory cell storing data by holding a charge in a capacitor;
- a sense amplifier circuit configured to sense and amplify a signal read from the memory cell;
- a read amplifier configured to further amplify an amplification signal from the sense amplifier circuit, and outputting read data;
- a write circuit configured to write, in a normal operation, write data to the memory cell, the write data being to be written to the memory cell, and write, in a twin-cell configuration in which two memory cells hold the same data, a first data read from a first memory cell of the memory cells to a second memory cell different from the first memory cell as a second data corresponding to the first data, the second memory cell being connected to a sense amplifier circuit different from that connected to the first memory cell; and
- a logic operation circuit configured to perform a logic operation using data read from the second memory cell and data read from the first memory cell as input values, and output third data as an operation value;
- the write circuit writing the third data back to the first memory cell.

14. The semiconductor memory device according to claim 13, wherein
the logic operation circuit is adapted to perform different logic operations between when a memory cell in the memory cell array that is to be subjected to scrambled writing is read and when a memory cell not to be subjected to scrambled writing is read.

15. The semiconductor memory device according to claim 13, wherein
a pair of adjacent bit-lines form a complementary bit-line pair, and each complementary bit-line pair has one sense amplifier circuit connected thereto.

16. The semiconductor memory device according to claim 13, wherein
the complementary bit-line pair has a twisted bit-line structure in which the bit-line pair intersects with each other in predetermined regions.

17. The semiconductor memory device according to claim 13, wherein
the logic operation circuit comprises:
- a first operation circuit configured to perform a first logic operation using data read from the second memory cell and data held in the data latch circuit as input values, and output fourth data;
- a second operation circuit configured to perform a second logic operation using data read from the second memory cell and data held in the data latch circuit as input values, and output fifth data;
- a multiplexer configured to output the fourth data as the third data when a memory cell in the memory cell array that is to be subjected to scrambled writing is read, and output the fifth data as the third data when a memory cell not to be subjected to scrambled writing is read.

18. The semiconductor memory device according to claim 13, wherein the write circuit further comprises a transfer gate circuit configured to selectively form a current path between the first bit-line connected to the first memory cell and the second bit-line connected to the second memory cell.

\* \* \* \* \*